United States Patent [19]
Cleveland et al.

[11] Patent Number: 5,650,966
[45] Date of Patent: Jul. 22, 1997

[54] TEMPERATURE COMPENSATED REFERENCE FOR OVERERASE CORRECTION CIRCUITRY IN A FLASH MEMORY

[75] Inventors: Lee E. Cleveland, Santa Clara; Johnny C. Chen, Cupertino, both of Calif.

[73] Assignee: Advanced Micro Devices, Inc., Sunnyvale, Calif.

[21] Appl. No.: 551,422

[22] Filed: Nov. 1, 1995

[51] Int. Cl.$^6$ .................................................. G11C 11/34
[52] U.S. Cl. ................................... 365/185.3; 365/185.2; 365/185.33
[58] Field of Search .......................... 365/185.2, 185.3, 365/185.29, 185.33

[56] References Cited

U.S. PATENT DOCUMENTS 5,157,626  10/1992  Watanabe ........................... 365/185.2

*Primary Examiner*—David C. Nelms
*Assistant Examiner*—F. Niranjan
*Attorney, Agent, or Firm*—Fliesler Dubb Meyer & Lovejoy LLP

[57] ABSTRACT

A reference circuit for overerase correction in a flash memory includes a reference flash memory cell biased in a substantially similar manner to that of an overerased flash memory cell. The leakage current for the reference flash memory cell is preset to a tolerable level of leakage current for a maximum operating temperature of the flash memory and the reference flash memory cell tracks the temperature characteristics of the overerased flash memory cell, to avoid costly overcorrection at high temperatures.

10 Claims, 4 Drawing Sheets

TEMPERATURE COMPENSATED REFERENCE FOR OVERERASE CORRECTION CIRCUITRY IN A FLASH MEMORY

BACKGROUND OF THE INVENTION

1. Field of Invention

The present invention pertains to the field of flash memory circuits. More particularly, this invention relates to a temperature compensated reference circuit for overerase correction circuitry in a flash memory.

2. Art Background

Prior flash memories typically contain an array of flash memory cells arranged as a set of rows and columns. Typically, each column of flash memory cells share a corresponding output sensing circuit. Such an output sensing circuit usually compares the current on a corresponding column of the flash cell array to a reference current to determine whether a selected flash memory cell of the column is in a program state or an erase state.

Typically, a flash memory cell in an erase state exhibits high electrical current characteristics which corresponds to a logical one. A flash memory cell in a program state, on the other hand, exhibits low electrical current characteristics which correspond to a logical zero.

Prior flash memories typically include erase circuitry that erases entire groups of flash memory cells simultaneously. Typically, such an erase operation on a flash memory cell involves the application of a negative voltage to the gate of the memory cell and a positive voltage on the source of the memory cell which removes electrons from the floating gate of the memory cell. Such an erase operation typically lowers the threshold voltage (Vt) for the flash memory cell to a low level that corresponds to a high electrical current state of an erased memory cell.

Nevertheless, the process control variations inherent in semiconductor process technologies usually creates a distribution in the level of threshold voltage Vt for a group of newly erased flash memory cells. In addition, some of the newly erased flash memory cells typically retain a negative level of threshold voltage Vt. Such a memory cell that reaches a threshold voltage Vt of less than zero is typically referred to as an overerased memory cell. Typically, the electrical current that flows in such an overerased flash memory cell is referred to as leakage current (Ileak).

Unfortunately, such a negative threshold voltage for erased memory cells may cause electrical current conduction on a column line that is driven by programmed memory cell during a read operation. As a consequence, the programmed memory cell in a low current state can appear to the output sense circuit as an erased memory cell due to the conduction of the overerased memory cell.

Prior flash memories typically implement a leakage correction mode that reduces the leakage current in overerased memory cells to a tolerable level. During a typical leakage correction mode, a relatively high voltage is applied to the drains of the memory cells while the gates and sources of the memory cells are pulled to the ground level. Such an application of voltage levels creates an inversion region in the overerased flash memory cells and causes electrons to be added to the floating gates of the overerased flash memory cells. Such adding of electrons to the floating gate eventually reduces the amount of leakage current in the overerased flash memory cell below the tolerable level.

In addition, prior flash memories typically includes circuitry that controls the duration of the leakage correction mode. FIG. 1 illustrates one prior reference circuit 20 for controlling the duration of the leakage correction mode in a flash memory. A flash memory cell C1 is shown contained within a flash cell array 10. A bias voltage of approximately 1 v is applied by a bit line bias circuit 100 to the drain of the flash memory cell C1 through a pullup transistor Q20 during leakage verification mode. A drain voltage generator 120 applies a correction level voltage to the drain of the flash memory cell C1 during leakage correction mode. In addition, the gate of the flash memory cell C1 is grounded during the leakage correction mode. The level of leakage current in the flash memory cell C1 is sensed via a signal line 22. The reference circuit 20 includes a comparator circuit 12 that compares the level of leakage current for the flash memory cell C1 to a reference current sensed on a signal line 24.

The reference current on the signal line 24 is generated by a sense ratio circuit comprising a set of transistors Q1 through QN. The reference circuit 20 also includes a reference flash memory cell C2. The gate of the reference flash memory cell C2 is coupled to a high voltage source level VX. The electrical current through the reference flash memory cell C2 is divided among the arrangement of parallel pullup transistors Q1 through QN. Typically, the number N is preselected to balance the reference current flowing through the reference flash memory cell C2 to the tolerable level of leakage current in the overerased flash memory cell C1. The comparator circuit 12 generates a control signal 26 to signal an end to leakage correction when the level of leakage current sensed via the signal line 22 falls below the level of current provided the sense ratio circuit on the signal line 24.

Typically, the sense ratio N of the reference circuit 20 is preselected by first determining the tolerable level of electrical leakage current through the overerased cell C1 at the maximum operating temperature of the flash memory. Typically, the maximum operating temperature of the flash memory represents the worst case level of electrical leakage current through the overerased cell C1. The worst case maximum temperature leakage current for the overerased cell C1 is then converted to the corresponding leakage current for the minimum operating temperature of the flash memory. Typically, the sense ratio is then preselected in order to provide the appropriate level of electrical current on a signal line 24 for a minimum operating temperature of the flash memory.

Unfortunately, such selection of a sense ratio at minimum operating temperature based upon a worst case analysis of leakage current at the maximum operating temperature typically causes overcorrection of overerased flash memory cells at high temperatures. Such a technique yields extremely long correction times and possible functional failures at high temperatures if the leakage correction mode was performed at a low temperature. In addition, such long correction time impose a fundamental limit on the available speed for accessing such a flash memory.

SUMMARY AND OBJECTS OF THE INVENTION

One object of the present invention is to provide a temperature compensated reference for overerase correction circuitry in a flash memory.

Another object of the present invention is to provide overerase correction in a flash memory over a wide range of operating temperatures.

A further object of the present invention is to provide overerase correction while avoiding time-consuming overcorrection at high operating temperatures.

Another object of the present invention is to prevent function failures in a flash memory at high operating temperatures when overerase correction was performed at a low operating temperature.

These and other objects are provided by a reference circuit for overerase correction in a flash memory comprising a reference flash memory cell which is biased in a substantially similar manner to that of array flash memory cell in the flash memory. The leakage current for the reference flash memory cell is preset to a tolerable level of leakage current for a maximum operating temperature of the flash memory. Thereafter, the temperature characteristics of the reference flash memory cell track the temperature characteristics of the array flash memory cell.

Other objects, features and advantages of the present invention will be apparent from the detailed description that follows.

BRIEF DESCRIPTION OF THE DRAWINGS

The present invention is described with respect to particular exemplary embodiments thereof and reference is accordingly made to the drawings in which.

DETAILED DESCRIPTION

Figure 1:
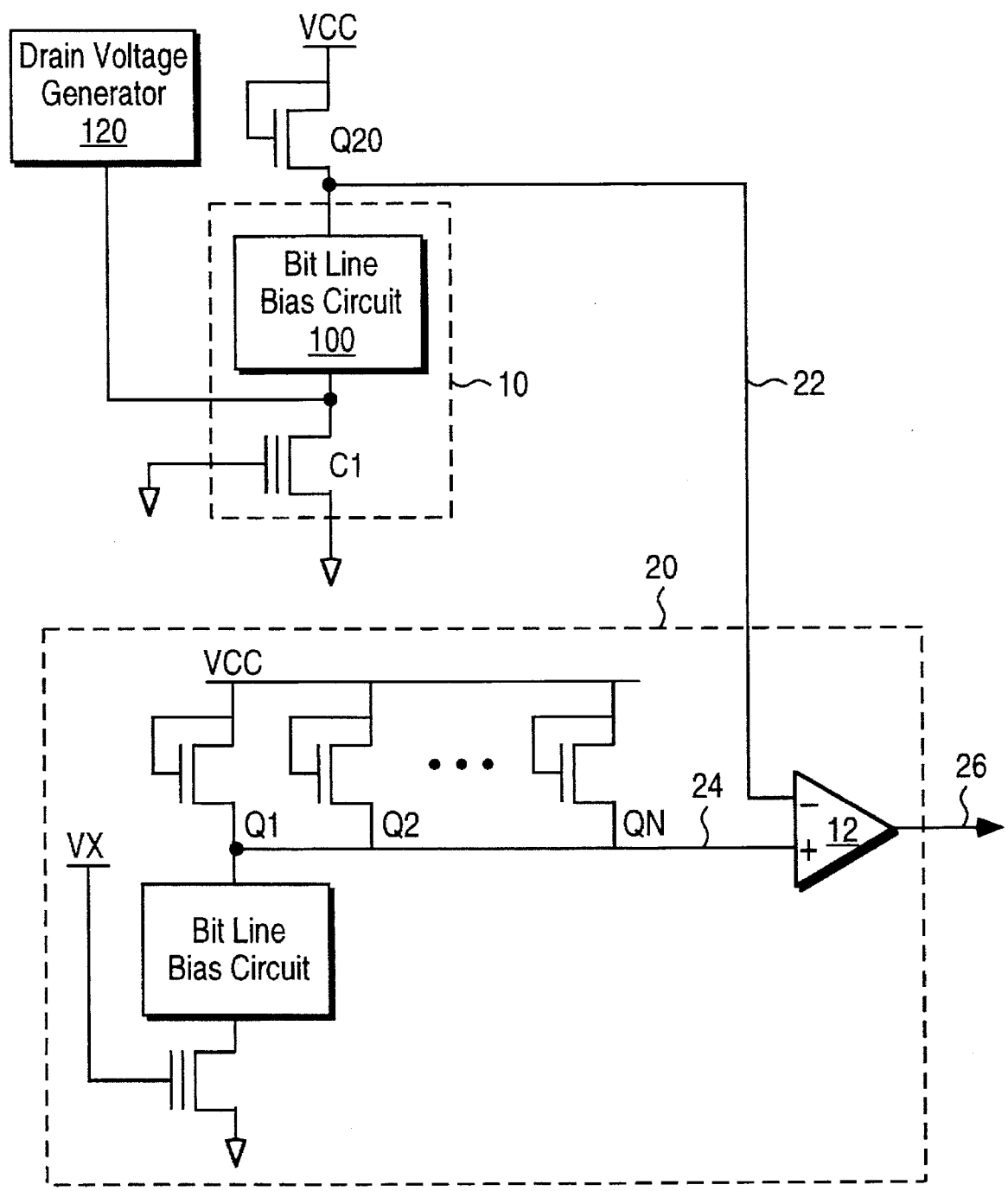
FIG. 1 illustrates one prior reference circuit for controlling the duration of the leakage correction mode in a flash memory.
Figure 2:
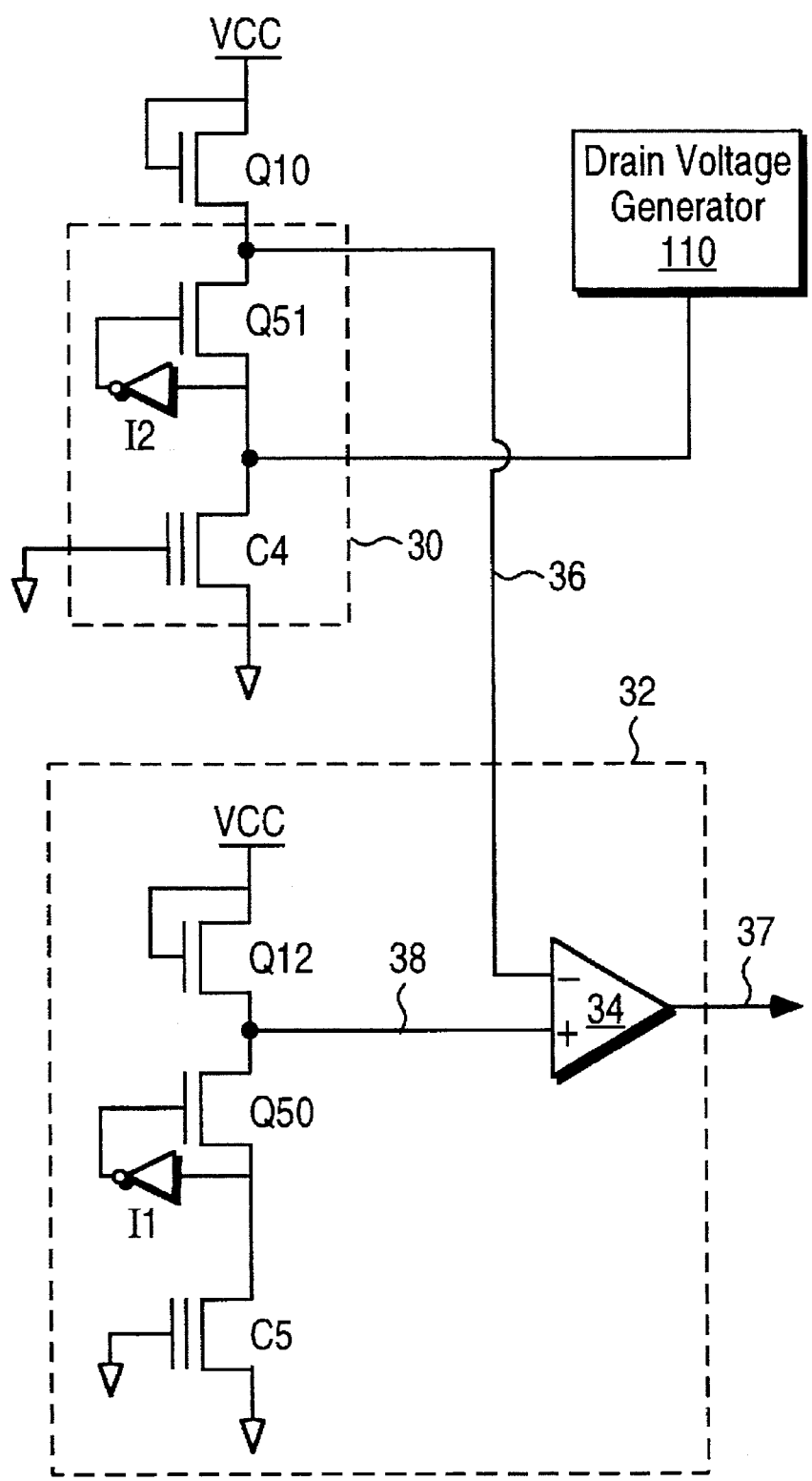
FIG. 2 illustrates a temperature compensated reference circuit for one embodiment.

FIG. 2 illustrates a temperature compensated reference circuit 32 for one embodiment. The temperature compensated reference circuit 32 controls the leakage correction of an overerased flash memory cell C4 contained within a flash cell array 30. The drain of the overerased flash memory cell C4 is coupled to a bit line bias circuit comprising a transistor Q51 and an inverter I2. A drain voltage generator 110 supplies 5.5 volts to the drain of the flash memory cell C4 during leakage correction. The drain voltage generator 110 in one embodiment is of the type described in U.S. Pat. No. 5,263,000.

The temperature compensated reference circuit 32 provides leakage verification and generates a control signal 37 that determines the time length for leakage correction. The comparator 34 enables leakage correction via control signal 37 as long as the leakage current sensed via line 36 is greater than the tolerable level indicated on line 38. The temperature compensated reference circuit 32 includes a comparator circuit 34, a pullup transistor Q12 and a reference flash memory cell C5. For one embodiment, both the gate and the source of the reference flash memory cell C5 are coupled to a common node. The drain of the reference flash memory cell C5 is coupled to a bit line bias circuit comprising a transistor Q50 and an inverter I1.

The overerased flash memory cell C4 and the reference flash memory cell C5 are manufactured on the same integrated circuit substrate according to a semiconductor process technology suitable for forming flash memories. In addition, the flash memory cells C4 and C5 each operate in the same temperature mode and are biased in a similar manner. As a consequence, the flash memory cell C4 contained in the array 30 and the reference flash memory cell C5 exhibit substantially similar temperature characteristics, and temperature changes in leakage current sensed on line 36 are similar to reference current changes on line 38.

The threshold voltage level Vt of the reference flash memory cell C5 is preset during manufacturing test of the flash memory that contains the flash cell array 30 and the temperature compensated reference circuit 32. The threshold voltage level Vt of the reference flash memory cell C5 is preset to optimize leakage correction at the maximum operating temperature of the flash memory.

As the operating temperature of the flash memory decreases to lower levels, the threshold voltages of the flash memory cell C4 in the array 30 and the reference flash memory cell C5 precisely track each other toward lower threshold voltage levels. Such tracking of threshold voltage levels between the flash memory cell C4 and the reference flash memory cell C5 provide balanced control of the leakage correction time with the comparator circuit 34.

Figure 3:
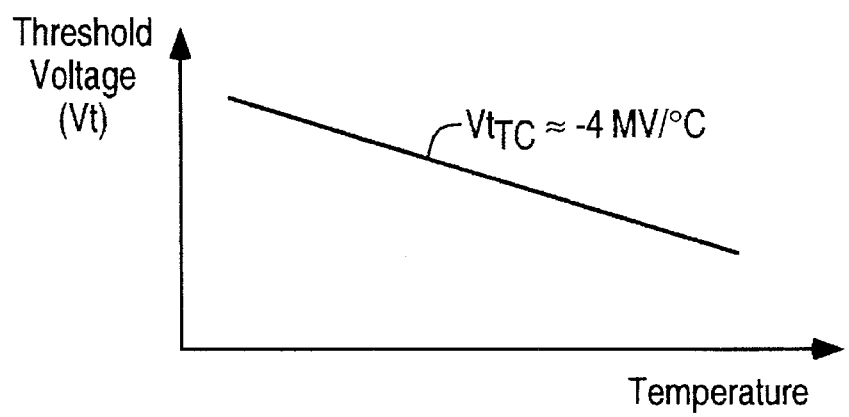
FIG. 3 illustrates the effect of operating temperature changes on threshold voltage Vt of a flash memory cell.

FIG. 3 illustrates the effect of operating temperature changes on threshold voltage Vt of the flash memory cell C4. In one embodiment, the threshold voltage reduces as operating temperature increases according to a slope give by a threshold voltage temperature coefficient ($Vt_{TC}$) which is approximately equal to minus 4 millivolts per degree centigrade.

Figure 4:
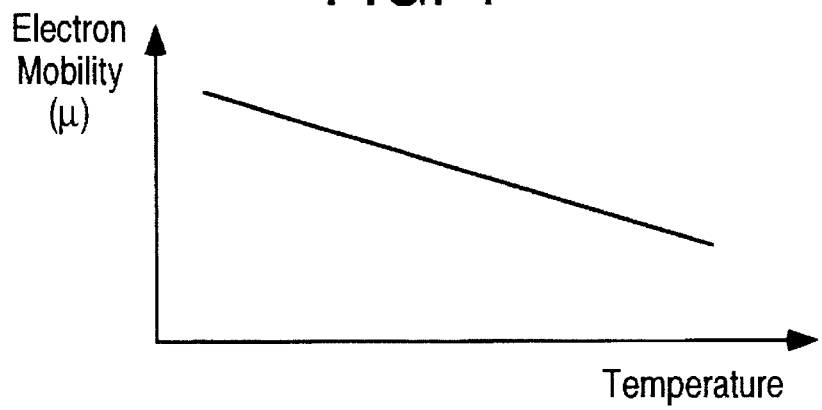
FIG. 4 illustrates the effect of operating temperature of the flash memory on the electron mobility within the flash memory cell.

FIG. 4 illustrates the effect of operating temperature on the electron mobility within the flash memory cell C4. As shown, the electron mobility decreases with increasing operation temperature. Such decreased electron mobility increases the correction time required to drive the leakage current of the flash memory cell C4 to a tolerable level at high operating temperatures.

The leakage current through the flash memory cell C4 at the highest operating temperature of the flash memory array 30 is given by the following equation (Equation 1).

$$Ileak_{TH} = K \cdot Vt_{TH}^2$$

where K is a function of electron mobility, oxide thickness of the flash memory cell C4, and the physical dimensions of the flash memory cell C4. The high temperature threshold voltage of the flash memory cell C4 is determined according to the following equation (Equation 2).

$$Vt_{TH} = \sqrt{Ileak_{TH}/K}$$

The threshold voltage of the flash memory cell C4 at the lowest operating temperature of the flash cell array 30 is given by the following (Equation 3).

$$Vt_{TL} = Vt_{TH} - (TH - TL) \cdot Vt_{TC}$$

This threshold voltage level corresponds to a leakage current given by the following equation (Equation 4).

$$Ileak_{TL} = K \cdot Vt_{TL}$$

For one embodiment, the parameter K is approximately equal to 6 microamps per square volt at a temperature of 125° C. and is approximately equal to 12 microamps per volt squared at an operating temperature of −55° C.

Thus, an example tolerable level of leakage current in the flash memory cell C4 equal to 15.48 microamps yields a high temperature threshold voltage of −1.606 volts. Converting this threshold voltage to a low operating temperature of −55° C. yields a low temperature threshold voltage of −0.89 volts using Equation 3. Equation 4 then reveals that the leakage current at the lower operating temperature of −55° C. is approximately 9.5 microamps.

It will be appreciated that the temperature compensated reference circuit 32 overcorrects the leakage current in the flash memory cell C4 at lower operating temperatures. For example, leakage current is corrected to 9.5 microamps at −55° C. when more leakage current is tolerable at that low temperature. However, such lower operating temperatures typically provide for relatively fast leakage correction mode due to the higher mobility of electrons in the flash memory cells of the array 30.

The temperature compensated reference circuit 32 is preset to provide the correct amount of leakage correction at maximum temperature and thereby prevents overcorrection at high temperature. Such a lack of overcorrection of leakage current at elevated temperatures of the flash cell array 30 prevents time-consuming overcorrection caused by the low electron mobility at high temperatures.

Figure 5:
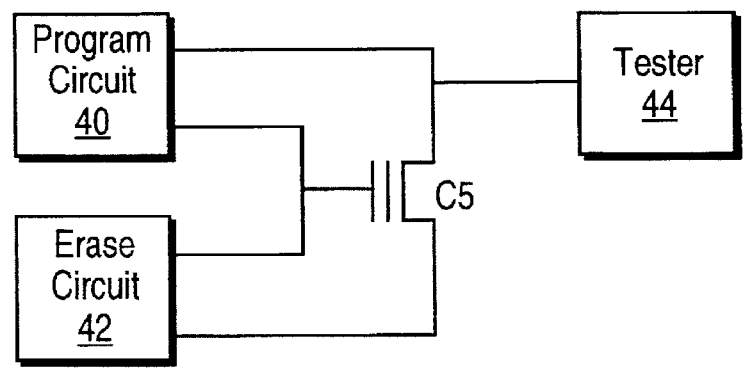
FIG. 5 illustrates the calibration of the reference flash memory cell during flash memory device manufacture.

FIG. 5 illustrates the calibration of the reference flash memory cell C5 during flash memory device manufacture. An erase circuit 42 in the flash memory applies a negative voltage between the source and the gate of the reference flash memory cell C5. The negative voltage is applied in pulses to incrementally reduce the threshold voltage Vt of the reference flash memory cell C5. A program circuit 40, on the other hand, applies a high positive voltage between the gate and the drain of the reference flash memory cell C5 to increase the threshold voltage Vt. The program and erase circuits 40 and 42 incrementally adjust the threshold voltage level as an external tester 44 senses the electrical current at the drain of the reference flash memory cell C5. The tester 44 causes the program circuit 40 and the erase circuit 42 to adjust the threshold voltage level of the reference cell C5 as required to obtain precise calibration of the high temperature leakage current in the reference cell C5 such that this preset leakage current at the maximum operating temperature is equal to the maximum tolerable leakage current in an array cell at maximum operating temperature.

Figure 6:
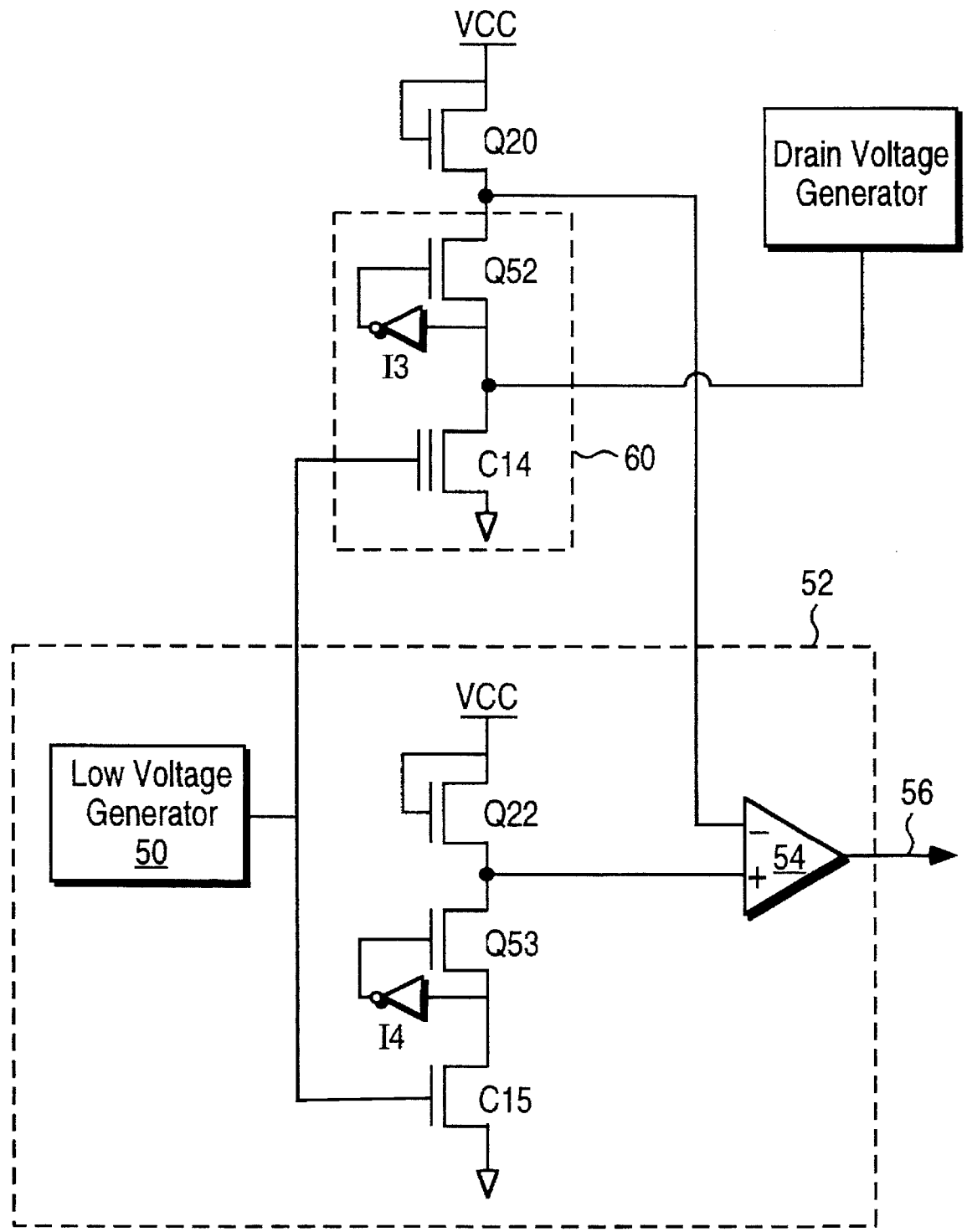
FIG. 6 illustrates a temperature compensated reference circuit in another embodiment.

FIG. 6 illustrates a temperature compensated reference circuit 52 in another embodiment. In this embodiment, a low voltage generator 50 is coupled to the gates of an overerased flash memory cell C14 and a reference flash memory cell C15. As before, the cells C14 and C15 function in the same operating region due to the similar biasing. For example, the bit line bias circuit for the cell C14 comprising a transistor Q52 and an inverter I3 is substantially similar to the bit line bias circuit for the cell C15 comprising a transistor Q53 and an inverter I4.

In an embodiment wherein the desired tolerable leakage current in the flash memory cell C14 is a very small value, the threshold voltage of the array cell C14 would be near zero. As discussed above, the threshold voltage of the array flash memory cell C14 decreases with increases in operating temperature. If the threshold voltage of the array flash memory cell C14 is close to zero at a high operating temperature, then the threshold voltage would be greater than zero as the array 60 transitions to a lower operating temperature. The low voltage generator 50 insures that the gates of the array flash memory cell C14 and the reference flash memory cell C15 remain on at such low temperatures.

The foregoing detailed description of the present invention is provided for the purposes of illustration and is not intended to be exhaustive or to limit the invention to the precise embodiment disclosed. Accordingly, the scope of the present invention is defined by the appended claims.

What is claimed is:

1. A reference circuit for controlling the duration of overerase correction in a flash memory comprising: an overerased flash memory cell in the flash memory, said overerased cell having a leakage current;

a reference flash memory cell biased in a substantially similar manner to that of said overerased flash memory cell, wherein a leakage current for said reference flash memory cell is preset to a tolerable level for a maximum operating temperature of said flash memory;

a pullup transistor; and a comparator for controlling the duration of said overerase correction, said comparator operative to compare leakage current from said overerased flash memory cell and said reference flash memory cell.

2. The reference circuit of claim 1, wherein the reference flash memory cell and the overerased flash memory cell are coupled to substantially similar bit line bias circuits.

3. The reference circuit of claim 1, wherein leakage current for the reference flash memory cell is preset by a program and erase circuit that adjusts a threshold voltage of the reference flash memory cell while an external tester measures the leakage current.

4. The reference circuit of claim 3, wherein the program and erase circuit includes a program circuit that applies a high positive voltage to the reference flash memory cell which increases the threshold voltage.

5. The reference circuit of claim 3, wherein the program and erase circuit includes an erase circuit that applies a high negative voltage to the reference flash memory cell which decreases the threshold voltage.

6. A flash memory, comprising:

an overerased flash memory cell;

a reference circuit for overerase correction comprising a reference flash memory cell biased in a substantially similar manner to that of the overerased flash memory cell;

a reference pullup transistor; and circuitry that presets a leakage current for the reference flash memory cell to a tolerable level of leakage current for a maximum operating temperature of the flash memory whenever the leakage current for the reference flash memory cell is compared to the leakage of the overerased memory cell.

7. The flash memory of claim 6, wherein the reference flash memory cell is coupled to a first bit line bias circuit and the overerased flash memory cell is coupled to a second bit line bias circuit wherein the first and second bit line bias circuits are substantially similar.

8. The flash memory of claim 6, further comprising a program and erase circuit that presets a leakage current for the reference flash memory cell by adjusting a threshold voltage of the reference flash memory cell while an external tester measures the leakage current.

9. The flash memory of claim 8, wherein the program and erase circuit includes a program circuit that applies a high positive voltage to the reference flash memory cell which increases the threshold voltage.

10. The flash memory of claim 8, wherein the program and erase circuit includes an erase circuit that applies a high negative voltage to the reference flash memory cell which decreases the threshold voltage.

\* \* \* \* \*